United States Patent
Mittelstädt et al.

(10) Patent No.: US 11,604,449 B2
(45) Date of Patent: Mar. 14, 2023

(54) APPARATUS FOR MONITORING AN ACTUATOR SYSTEM, METHOD FOR PROVIDING AN APPARATUS FOR MONITORING AN ACTUATOR SYSTEM AND METHOD FOR MONITORING AN ACTUATOR SYSTEM

(71) Applicant: Siemens Aktiengesellschaft, Munich (DE)

(72) Inventors: Sebastian Mittelstädt, Munchen-Haidhausen (DE); Markus Michael Geipel, Munich (DE); Klaus Arthur Schmid, Munich (DE); Klaus-Peter Hitzel, Nuremberg (DE); Thomas Runkler, Munich (DE); Michael Schnurbusch, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 419 days.

(21) Appl. No.: 16/963,368

(22) PCT Filed: Jan. 11, 2019

(86) PCT No.: PCT/EP2019/050623
§ 371 (c)(1),
(2) Date: Jul. 20, 2020

(87) PCT Pub. No.: WO2019/141593
PCT Pub. Date: Jul. 25, 2019

(65) Prior Publication Data
US 2021/0365000 A1 Nov. 25, 2021

(30) Foreign Application Priority Data

Jan. 22, 2018 (EP) .................................. 18152736

(51) Int. Cl.
*G05B 19/00* (2006.01)
*G05B 19/4063* (2006.01)
*G06N 20/00* (2019.01)

(52) U.S. Cl.
CPC ......... *G05B 19/4063* (2013.01); *G06N 20/00* (2019.01); *G05B 2219/42319* (2013.01)

(58) Field of Classification Search
None
See application file for complete search history.

(56) References Cited

U.S. PATENT DOCUMENTS

| 5,629,870 | A | 5/1997 | Farag et al. |
| 2001/0024163 | A1* | 9/2001 | Petite ..................... G01V 1/364 340/630 |

(Continued)

OTHER PUBLICATIONS

Yunosuke Maki et al: "A Neural-Network Approach to Fault Detection and Diagnosis in Industrial Processes", IEEE Transactions on Control Systems Technology, IEEE Service Center, New York, NY, US, vol. 5, No. 6, XP011013854, I SSN: 1063-6536; Section IV.B; pp. 536; Nov. 1997.

(Continued)

*Primary Examiner* — Paul B Yanchus, III
(74) *Attorney, Agent, or Firm* — Wolter Van Dyke Davis, PLLC (57) ABSTRACT

An apparatus for monitoring an actuator system, a method for providing an apparatus for monitoring an actuator system, and a method for monitoring an actuator system where the has at least one actuator and at least one data output signal. An anomaly detector detects anomalies. A suppressing engine determines time periods in which a control intervention has been performed. In a resulting monitoring signal, only anomalies are indicated which do not overlap with time periods in which the control intervention has been performed resulting in less irrelevant alerts and false posi- (Continued)

tives output to a human supervisor monitoring the actuator system. The apparatus for monitoring a system may be provided with a plurality of actuators that may affect one another over time. The apparatus may be applied to a system of submersible pumps, or a system of conveyor belts.

16 Claims, 5 Drawing Sheets

(56) References Cited

U.S. PATENT DOCUMENTS

| | | |
|---|---|---|
| 2004/0002776 A1 | 1/2004 | Bickford |
| 2014/0019092 A1 | 1/2014 | Phelps et al. |
| 2016/0155315 A1* | 6/2016 | McElhinney ....... G01M 99/008 340/502 |
| 2017/0069198 A1 | 3/2017 | Kwon et al. |

OTHER PUBLICATIONS

PCT International Search Report and Written Opinion of International Searching Authority dated Nov. 4, 2019 corresponding to PCT International Application No. PCT/EP2019/050623 filed Nov. 1, 2019.

* cited by examiner

APPARATUS FOR MONITORING AN ACTUATOR SYSTEM, METHOD FOR PROVIDING AN APPARATUS FOR MONITORING AN ACTUATOR SYSTEM AND METHOD FOR MONITORING AN ACTUATOR SYSTEM

CROSS REFERENCE TO RELATED APPLICATIONS

This application is the US National Stage of International Application No. PCT/EP2019/050623 filed 11 Jan. 2019, and claims the benefit thereof. The International Application claims the benefit of European Application No. EP18152736 filed 22 Jan. 2018. All of the applications are incorporated by reference herein in their entirety.

FIELD OF THE INVENTION

The present invention pertains to an apparatus for monitoring an actuator system with at least one actuator and at least one data output signal. The present invention also pertains to a method for providing an apparatus for monitoring an actuator system with at least one actuator and at least one output signal. The present invention further pertains to a method for monitoring an actuator system with at least one actuator and with at least one data output signal.

An actuator system maybe understood as any system comprising at least one actuator, i.e. one actuator such as a motor, a pump, a conveyor belt and so on, or a plurality of actuators, such as a plurality of motors, a plurality of pumps, and a plurality of conveyor belts and so on. Data output signals should be understood as comprising, in particular, data output signals that relate to the plurality of actuators, for example data output signals that indicate a current condition of any, or multiple, of the plurality of actuators. The actuator system may comprise at least one sensor which is (or are) configured and arranged to provide the at least one data output signal, or at least part of a plurality of data output signals, in particular by measuring or detecting properties of a single actuator, or of at least some of a plurality of actuators of the actuator system.

Although applicable for any kind of actuator system, the present invention and the corresponding underlying problems and solutions offered herein will be explained in further detail in conjunction with a system of pumps as the actuator system, specifically submersible pumps such as electrical submersible pumps.

BACKGROUND OF THE INVENTION

Nowadays, with methods and tools for communication between devices developing and improving, actuator systems become more and more complex and provide more and more data output signals. In general, highly skilled personnel must be trained and employed to monitor the enormous quantity of data output signals in order to make sure that any anomalies are detected as soon as possible. In many cases, the oversight of an anomaly can cause damage to one or more of the actuators which is often costly to repair, if it all possible. The increasing number of data output signals, however, means that the task of overseeing the operation of the actuator system becomes more and more difficult and that an increasing number of highly skilled personnel has to be employed in order to sift through the vast quantities of data output signals.

Similarly, improved communication channels and bandwidths allow for very complex data output signals to be provided even by a single sensor and/or relating to a single actuator. In that situation, it can be prohibitively difficult to completely oversee the operation even of an actuator system comprising, or consisting of, a single actuator.

As one possible solution, automated anomaly detecting systems have been used. Such systems generally use predetermined rules which are applied to the data output signals in order to identify certain anomalies and to alert human personnel to occurring or potential problems. One problem of this approach is, however, that such a set of strict rules has difficulties with identifying previously unencountered anomalies. On the other hand, when the rules are modified to try to identify any suspicious behavior, this might result in a lot of false positives, again increasing the need for expensive human manpower.

One particular additional problem that has been noticed by the inventors is that quite often actuator-affecting intervention procedures such as a control intervention are deliberately performed in or on the actuator system. Such deliberate actuator-affecting intervention procedures may cause suspicious behavior in one or more of the actuators and therefore often cause anomaly detecting systems to falsely detect an anomaly.

For example, consider an actuator system consisting of, or comprising, electrical submersible pumps which are mining oil downhole. A plurality of sensors is usually installed with the electrical submersible pumps in order to measure data relating to the pumps such as ground pressure data, head pressure data, stub pressure data, an oil temperature, a motor current and so on, and to output said measured data in one or more corresponding data output signals. If a pump is tripped due to some kind of damage, usually data output signals, that is, the sensor data, of the last few months are analyzed to detect suspicious patterns and anomalies in the data.

In U.S. Pat. No. 5,629,870 A, a method and an apparatus for determining a failure during operation of an electric induction machine is described.

Based on the analysis, it is tried to estimate the root cause and the potential damage to the respective pump. The submersible pump is not lifted if the damage is too severe or the lift is too expensive in comparison to the benefit. Other damages may be fixed by simply flushing the pump if the root cause is a blockage, for example due to paraffin. However, a manual control intervention, that is, a actuator-affecting intervention procedure performed on the system of pumps, may cause anomalous sensor signals which will then confuse the issue and/or cause false alarms to be raised when the data output signals are analyzed.

For example, switching on a certain pump may cause a rapid rise in pressure at a portion of that pump. Then, a pressure data output signal of that pump may closely resemble a pattern of a pressure data output signal that occurs when said pump is blocked. A blocked pump is one example of an anomaly.

As another example, switching off a pump can cause a low head pressure at another pump which may lead to another detection of anomalies at that other pump. Such false positives will usually be sent as warnings or alerts to an operator who is thus being overburdened with useless alerts.

This may adversely influence the monitoring of the actuator system since the operator might miss real alarms which lead to real failures when the operator is instead focused on dealing with the false alarms.

SUMMARY OF THE INVENTION

It is one of the objects of the invention to provide an apparatus and a method for monitoring an actuator system with at least one actuator (i.e. with a single actuator or with a plurality of actuators) and at least one data output signal (i.e. a single data output signal or a plurality of data output signals) which produces fewer false alarms while at the same time avoids missing any actual anomalies. One of the basic ideas on which the invention is based is to try identifying when an actuator-affecting intervention procedure is performed. Then, one may exclude a time period from being marked as containing an anomaly when during that time period an actuator-affecting intervention procedure has been performed or has had an effect.

According to a first aspect of the invention, an apparatus for monitoring an actuator system with at least one actuator (i.e. with a single actuator or with a plurality of actuators) and at least one data output signal (i.e. a single data output signal or a plurality of data output signals) comprises: an anomaly detector configured to detect, based on the at least one data output signal, an anomaly occurring in the actuator system, and further configured to output an anomaly signal indicating at least one anomaly time period in which the detected anomaly has occurred; a suppressing engine comprising a first trained artificial intelligence entity trained and configured to determine, based on the at least one data output signal, that a actuator-affecting intervention procedure has been performed in or on the actuator system, and to output a suppressing signal indicating at least one suppressing time period based on the actuator-affecting intervention procedure that has been performed; and a combiner logic configured to determine time periods of interest for the monitoring of the actuator system, advantageously for an individual actuator of the actuator system, and to output a monitoring signal indicating the determined time periods of interest, wherein the combiner logic determines each anomaly time period indicated by the anomaly signal as a time period of interest if (advantageously: if and only if and only as long as) the suppressing signal does not indicate a simultaneous suppressing time period.

In some advantageous embodiments, the actuator system comprises a single actuator. The actuator system may comprise at least one sensor configured to generate at least one data output signal indicating a property and/or condition (temperature, functionality, availability, state of degradation, ground pressure data, head pressure data, stub pressure data, an oil temperature, a motor current and/or the like) of the single sensor. The actuator system may comprise a plurality of sensors configured to generate a plurality of data output signals indicating at least one property and/or condition of the actuator of the actuator system.

In some advantageous embodiments, the actuator system may comprise a plurality of actuators. The actuator system may comprise at least one sensor configured to generate at least one data output signal indicating a property and/or condition (temperature, functionality, availability, state of degradation and/or the like) of any (e.g. of a single, of some, or of all) of the plurality of sensors. The actuator system may comprise a plurality of sensors configured to generate a plurality of data output signals, each indicating at least one property and/or condition of the actuator of the actuator system.

In some advantageous embodiments, the actuator system comprises a plurality of actuators and a plurality of sensors for each actuator, each of the plurality of sensors for each actuator being configured to generate a data output signal indicating a property and/or condition of the corresponding actuator. The actuator system may comprise a set of sensors for each of a plurality of actuators, each set of sensor configured to generate data output signals indicating the same set of properties and/or conditions for all of the actuators. For example, each actuator of the actuator system may be provided with an oil temperature sensor and a motor current sensor.

The apparatus may also be designated as a device or as a system. The apparatus may be realized in terms of hardware and/or in terms of software, as will be described in more detail in the following.

The suppressing time period may be a time period which includes a time period in which the actuator-affecting intervention procedure has been performed, for example a time period that corresponds exactly to the time period in which the actuator-affecting intervention procedure has been performed. Alternatively, or additionally, the suppressing time period for a specific actuator based on an actuator-affecting intervention procedure that has been performed at or on at least one other actuator of the same actuator system may be a time period in which said actuator-affecting intervention procedure will affect the specific actuator for which the suppressing time period is determined. This advantageously addresses the fact that some actuator-affecting intervention procedures will have a delayed effect that propagates through the actuator system. The suppressing time period for each individual actuator may thus be determined to be a time period in which the delayed effect reaches said individual actuator.

The monitoring signal may be a signal relating to an individual actuator of, or out of, the actuator system. In other words, the monitoring signal may be a monitoring signal for monitoring that individual actuator. The time periods of interest of the monitoring signal then may indicate to a human supervisor that the supervisor should check the corresponding individual actuator for anomalies.

Whenever herein a signal is mentioned, it should be understood that said signal may specifically indicate a quantity as a function of time, unless explicitly indicated otherwise.

Advantageously, the apparatus may be configured to provide multiple monitoring signals relating to multiple of the actuators of the actuator system. Advantageously, the apparatus is configured to provide a monitoring signal for each subset of a number of subsets of actuators of the actuator system. The apparatus may be configured to provide a monitoring signal least for each individual actuator of at least one of the subsets of the actuator system. Even more advantageous, the apparatus is configured to provide a monitoring signal for each individual actuator of the actuator system.

In some embodiments, the system may provide additional information such as suggestions for dealing with an anomaly, further tests that can be performed and so on.

By providing the suppressing engine which can tell when a actuator-affecting intervention procedure has been performed, and by then ignoring anomalies detected by the anomaly detector which fall into such suppressing time periods, a lot of false alerts, or false positives, may be avoided.

In the foregoing some cases have been described, in the context of a system of pumps, when a actuator-affecting intervention procedure such as a control intervention could cause one or more false alerts.

However, using the present invention, when a pump is switched off or switched on, the suppressing engine will indicate, in the suppressing signal, at least one suppressing time period which includes the time period in which the actuator-affecting intervention procedure (in this case switching on or off the pump) has occurred. The suppressing time will overlap the anomaly period determined by the anomaly detector as a result of the actuator-affecting intervention procedure. In such a case, even though the anomaly detector has detected an anomaly time period, the combiner logic will not add the anomaly time period indicated by the anomaly signal as a period of interest to the monitoring signal. The user tasked with monitoring may then e.g. be not informed of any anomaly at all, or the user may be informed that an irrelevant anomaly has occurred.

Actuator-affecting intervention procedures can include control interventions such as switching on or off an actuator, switching on or off another actuator related to an actuator monitored, controlling a frequency change of an actuator such as a frequency of a pump, pigging a pipe or pipeline, restarting an actuator after a switch-off and so on.

In some advantageous embodiments, the actuator system being monitored may consist of, or comprise, of a single pump, specifically a submersible pump, in particular an electrical submersible pump, or comprise, or consist of, a plurality of such pumps. As an alternative, the actuator system may consist of, or comprise, a conveyor belt, or comprise, or consist of, a plurality of conveyor belts.

As has been mentioned before, the present invention is particularly useful in systems where a actuator-affecting intervention procedure in or on one specific actuator of the actuator system influences the operation of one or more actuators of the actuator system, even when said influence is subject to considerable temporal delay. In the example of submersible pumps, turning off, or on, one pump will often result in a delayed pressure change in another pump. Operation interventions outside of a monitored pump propagate their effects e.g. through head pressure signals via a connecting pipe system. Detecting various levels in head pressure (as part of the at least one data output signal) then yields knowledge about possible actuator-affecting intervention procedures at one or more other pumps and/or maintenance work in one or more pipes.

One distinguishing feature of a causal relation between an actuator-affecting intervention procedure at one point of the pump system and an apparent anomaly at another point of the pump system may be a temporal lead of the head pressure effect, i.e. level changes in at least one data output signal relating to head pressure may occur before effects in at least one internal data output signal such as one relating to an annulus pressure.

In the case of conveyor belts, a blockage or a change of speed in one conveyor belt may result in another conveyor belt being loaded with much more or much less material than would usually be expected.

However, it should be understood that the present invention may also be used for other actuator systems apart from pump system or conveyor belt systems. The invention may, for example, be also used for actuator systems comprising a single actuator, and a plurality of data output signals may refer to properties and conditions of said single actuator.

When in the foregoing or in the following the outputting of a signal is mentioned, it should also be understood that this does not mean that the signal is necessarily output by the apparatus to the outside of the apparatus. Instead, outputting a signal may comprise the outputting of an internal signal that is processed within the apparatus itself. Some signals may be outputted as distinctly measurable physical signals and/or some signals may be realized as variables in a program code, as stored function values in respective data tables within a memory or the like.

According to a second aspect of the invention, a method for monitoring an actuator system with at least one actuator (i.e. with a single actuator or with a plurality of actuators) and with at least one data output signal (i.e. with a single data output signal or with a plurality of data output signals) is provided, the method comprising steps of: receiving the at least one data output signal; detecting, based on the at least one data output signal, an anomaly occurring in the actuator system; outputting an anomaly signal indicating at least one anomaly time period in which the detected anomaly has occurred; determining, using a first trained artificial intelligence entity, based on the at least one data output signal, that an actuator-affecting intervention procedure has been performed in or on the actuator system, outputting a suppressing signal indicating at least one suppressing time period based on the actuator-affecting intervention procedure that has been performed; determining at least one time period of interest for the monitoring of the actuator system, advantageously for the monitoring of an individual actuator of the actuator system, wherein each anomaly time period indicated by the anomaly signal is determined as a period of interest if (advantageously: if and only if and only as long as) the suppressing signal does not indicate a simultaneous suppressing time period; and outputting a monitoring signal indicating the determined time periods of interest.

The invention also provides, according to a third aspect, a method of providing an apparatus for monitoring an actuator system with at least one actuator (i.e. with a single actuator or with a plurality of actuators) and at least one data output signal (i.e. with a single data output signal or with a plurality of data output signals), the method comprising the steps of: providing an anomaly detector configured to detect, based on the at least one data output signal, an anomaly occurring in the actuator system, and further to output an anomaly signal indicating at least one anomaly time period in which the detected anomaly has occurred; providing a suppressing engine comprising a first artificial intelligence entity; configuring the first artificial intelligence entity and training the first artificial intelligence entity (advantageously using samples of time periods in which at least one actuator-affecting intervention procedure has been performed), to determine, based on the at least one output signal, that an actuator-affecting intervention procedure has been performed in or on the actuator system, and to output a suppressing signal indicating at least one suppressing time period based on the actuator-affecting intervention procedure that has been performed; and providing a combiner logic configured to determine time periods of interest for the monitoring of the actuator system and to output a monitoring signal indicating the determined time periods of interest, wherein the combiner logic is configured such as to determine each anomaly time period indicated by the anomaly signal as a time period of interest if the suppressing signal does not indicate a simultaneous suppressing time period.

Whenever it is recited that an element is provided configured to do something, it shall be understood that this may comprise either (or both of) providing the element in a configured state and/or providing the element and then configuring it in the desired way.

The invention also provides, according to a fourth aspect, an actuator system with at least one actuator (i.e. with a single actuator or with a plurality of actuators) and a plurality of data output signals, the actuator system comprising an apparatus according to an embodiment of the first aspect for monitoring the actuator system.

Additional advantages and dissolution of additional problems will be apparent from the subject matter of the dependent claims as well as from the description of the drawings.

In some advantageous embodiments of the first aspect, the anomaly detector comprises a second trained artificial intelligence entity configured and trained to output the anomaly signal. Such a trained artificial intelligence entity is advantageously able to detect not only known but also unknown anomalies. The second trained artificial intelligence entity may e.g. be, or comprise, an artificial neuronal network such as a convolutional autoencoder or any other novelty detection model.

In some advantageous embodiments, the apparatus further comprises an anomaly classifier and a modifier logic. The anomaly classifier is configured to detect, based on the plurality of data output signals, a priority-rated anomaly, and to output a priority signal indicating at least one priority time period based on the priority-rated anomaly.

The priority time period may specifically include a time period throughout which the priority-rated anomaly has occurred. In particular, the priority time period may be identical with the time period throughout which the priority-rated anomaly has occurred. Additionally or alternatively, the priority time period may be determined while taking into account a propagation time of the detected priority-rated anomaly through the actuator system. For example, when the monitoring signal is for monitoring an individual actuator, the priority time period may be determined as the time period in which a detected priority-rated anomaly affects said individual actuator.

Advantageously, the anomaly classifier comprises, or consists of, an artificial neuronal network, e.g. as a convolutional autoencoder or any other novelty detection model. Even more advantageously, the third artificial neuronal network is trained with samples of time periods in which at least one predetermined anomaly has occurred. In this way, a desirably high accuracy of the anomaly classifier can be achieved.

The modifier logic may be configured to adapt the monitoring signal such that the monitoring signal indicates the at least one time period indicated by the priority signal as a period of interest (in particular regardless of whether additional periods of interest are already indicated by the monitoring signal as a result of the operation of the anomaly detector).

The anomaly classifier, together with the modifying logic, is advantageously employed to provide the apparatus with the ability to determine actual, known anomalies. The anomaly classifier is a useful addition to the anomaly detector: while the anomaly detector is able to detect also unknown anomalies, its anomaly signal may be suppressed by the suppressing engine. The anomaly classifier will on the one hand mostly be able to recognize only known anomalies, but on the other hand it is not influenced by the suppressing engine and may thus also recognize anomalies occurring during suppressing time periods. The combination therefore provides an apparatus having high reliability while at the same time having a low probability of issuing false alerts.

In some advantageous embodiments, the suppressing engine further comprises a determining engine configured to determine, based on a predetermined set of rules and on the plurality of data output signals, further suppressing time periods. The suppressing engine is configured to output the suppressing signal such that it indicates also the suppressing time periods determined by the determining engine. In this way, the suppressing engine may be able to detect suppressing time periods even more precisely.

In some advantageous embodiments, the apparatus further comprises output circuitry and/or and output device configured to output a visual, acoustic and/or haptic signal to a user based on the time periods of interest indicated by the monitoring signal. Thus, the user may be alerted to possible anomalies.

In some advantageous embodiments, the anomaly signal and/or the suppressing signal and/or the monitoring signal has a target set of discrete values. This simplifies the processing of the signals. In particular, any or all of those signals may be provided as binary signals as a function of time, or, in other words, as binary timelines. In that case, simple logical operators such "OR", "AND" and so on may be used to process and/or combine signals.

In some advantageous embodiments, the anomaly detector is configured to produce a preliminary anomaly signal having a target set of a range of continuous values. The anomaly detector may further comprise a threshold comparator configured to perform a comparison of the preliminary anomaly signal with a threshold value and to output the anomaly signal either with a first value that indicates that an anomaly has occurred or with a second value that indicates that no anomaly has occurred, depending on a result of the comparison. In particular, the threshold comparator may in that way process the preliminary anomaly signal to create a binary timeline that is easier to process further.

In some advantageous embodiments, the monitoring signal has a target set of a range of continuous values, wherein a time period of interest is indicated by the monitoring signal having values within a first sub-range of the target set, and wherein time periods that are not time periods of interest are indicated by the monitoring signal having values within a second sub-range of the target set. Advantageously, the first and the second sub-ranges are immediately adjacent but non-overlapping such that there exists a threshold value according to which it is determined whether a time period of the monitoring signal indicates a period of interest or not.

In some advantageous embodiments, at least some of the plurality of data output signals relate to at least one pump, and at least one monitoring signal is provided for monitoring the at least one pump. In some especially advantageous embodiments, at least some of the plurality of data output signals relate to a plurality of submersible pumps (in particular electrical submersible pumps), and at least one monitoring signal is provided for monitoring at least one of the plurality of submersible pumps. In a particularly advantageous embodiment, the apparatus produces at least one monitoring signal for each electrical pump.

In some advantageous embodiments of the system according to the fourth aspect of the invention, the actuator system comprises at least one pump and at least some of the plurality of data output signals relate to the at least one pump. In some especially advantageous embodiments, the actuator system comprises a plurality of submersible pumps, and at least some of the plurality of data output signals relate to the plurality of submersible pumps. Even more advantageously, at least some of the submersible pumps are electrical submersible pumps (ESP). In a particularly advantageous embodiment, the actuator system comprises (or outputs) at least one data output signal for each pump, and the apparatus produces at least one monitoring signal for each pump.

In some advantageous embodiments of the third aspect of the invention, a second artificial neuronal network is provided as, or as part of, the second trained artificial intelligence entity, and the second artificial neuronal network is trained with samples of time periods in which no anomaly has occurred. Thus the second trained artificial intelligence entity has a particularly high accuracy when detecting even unknown anomalies.

The method according to embodiments of the third aspect may comprise a step of configuring the second artificial intelligence entity (which advantageously consists of, or comprises, a second artificial neuronal network), and of training the second artificial intelligence entity (advantageously the second artificial neuronal network) using samples of time periods in which no anomaly has occurred.

In some advantageous embodiments of the third aspect of the invention, a third artificial neuronal network is provided as, or as part of, the anomaly classifier for determining the priority-rated anomaly. The third artificial neuronal network is advantageously trained with samples of time periods in which at least one known (or predetermined) anomaly has occurred. Thus the anomaly classifier has a particularly high accuracy when detecting known anomalies.

The method according to embodiments of the third aspect may comprise the steps of: providing an anomaly classifier configured to detect, based on the at least one data output signal, a priority-rated anomaly, and to output a priority signal indicating at least one priority time period based on the priority-rated anomaly that has been detected, wherein a third artificial intelligence entity (advantageously a third artificial neuronal network) is provided as part of the anomaly classifier for determining the priority-rated anomaly.

The method may further comprise the steps of: training the third artificial intelligence entity (advantageously the third artificial neuronal network) with samples of time periods in which at least one known anomaly has occurred; and providing a modifier logic configured to adapt the monitoring signal such that the monitoring signal indicates the at least one priority time period (indicated by the priority signal as a time period of interest.

In some advantageous embodiments of the second aspect of the invention, the method further comprises a step of determining, based on a predetermined set of rules and on the plurality of data output signals, further suppressing time periods, wherein the suppressing signal is output such that it also indicates the suppressing time periods determined thereby. In this way the reliability and accuracy of the suppressing signal may be further improved.

BRIEF DESCRIPTION OF THE DRAWINGS

The invention will be explained in greater detail with reference to exemplary embodiments depicted in the drawings is appended.

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION OF THE INVENTION

Figure 1:
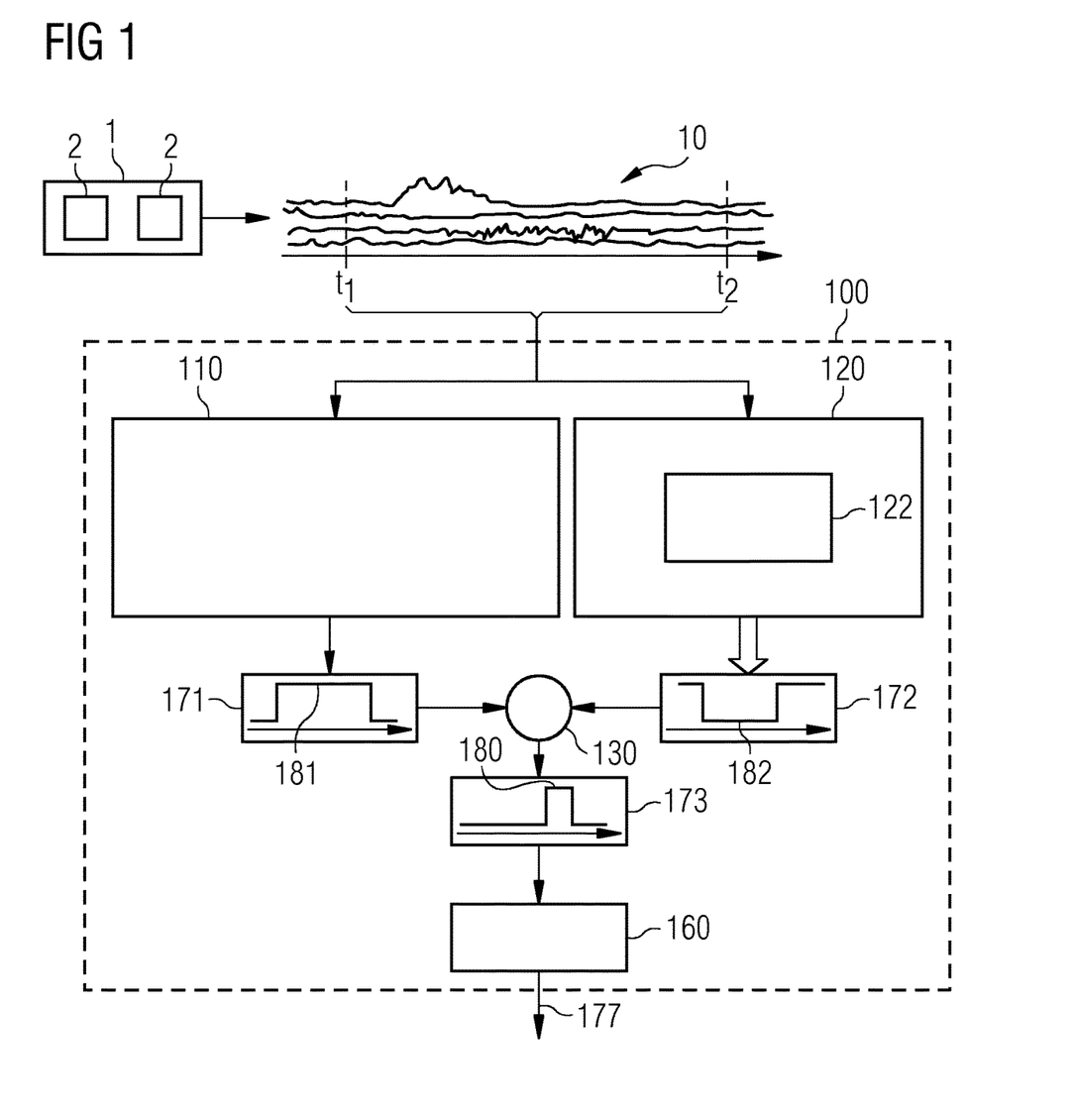
FIG. 1 schematically illustrates an apparatus according to an embodiment of the first aspect of the present invention.

FIG. 1 shows a schematic illustration of an apparatus 100 for monitoring an actuator system 1 with a plurality of actuators 2 and a plurality of data output signals 10. Some elements, such as a data input interface of the apparatus 100 for receiving the plurality of data output signals 10 from the actuator system 1 are not explicitly shown.

In the following, the creation of a single monitoring signal 173 by the apparatus 100 will be described in detail. Said monitoring signal may in particular be a monitoring signal 173 for the monitoring of one specific actuator 2, e.g. one specific pump. Advantageously, the data output signals 10 used for the creation of the described monitoring signal for the one specific actuator 2 will relate not only to that one actuator 2 but will relate to multiple, or even all, of the actuators 2 of the actuator system 1.

It will be understood that the apparatus 100 can, and in practice will, provide a plurality of such monitoring signals 173 for a plurality of actuators 2. Any options, modifications or variations described herein with respect to the one monitoring signal 173 similarly relate to all of the monitoring signals 173 that may be provided by the apparatus 100. Advantageously, the apparatus 100 is configured to provide at least one monitoring signal 173 for each of the actuators 2 of the actuator system 1.

Furthermore, as a specific example, the actuator system 1 in this Figure and the following Figures may be a system 1 of pumps as actuators 2, in particular a system 1 of submersible pumps, especially of electrical submersible pumps. However, the apparatus 100 could equally be applied to any other system 1 of actuators 2, e.g. a system of conveyor belts as actuators 2.

The apparatus 100 comprises an anomaly detector 110 configured to detect, based on the plurality of data output signals 10, an anomaly occurring in the actuator system 1. The anomaly detector 110 is further configured to output an anomaly signal 171 indicating at least one anomaly time period 181 in which the detected anomaly has occurred. Advantageously, the anomaly time period 181 starts when the anomaly has started to occur and ends when the anomaly has ended; however, the anomaly time period 181 may also be determined with a fixed or variable duration added before the anomaly has occurred and/or after the anomaly has ended.

The anomaly detector 110 may be implemented as pure hardware, e.g. as comprising transistors, logic gates and other circuitry. Additionally, the anomaly detector 110 may be partially realized in terms of software. As such, the anomaly detector 110 may comprise a processor and memory storing a software or a firmware that is executed by the processor. Signals such as the plurality of data output signals 10 of the actuator system 1 may be received by an input interface of the anomaly detector 110 and signals such as the anomaly signal 171 which the processor of the anomaly detector 110 creates may be outputted by an output interface of the anomaly detector 110. The anomaly detector 110 may be implemented as a microcontroller, as an ASIC, FPGA, a microprocessor and so on, optionally combined with a non-volatile memory unit.

The apparatus 100 also comprises a suppressing engine 120. The suppressing engine 120 comprises a first trained artificial intelligence entity 122 which is trained and configured to determine, based on the plurality of data output signals 10, that a actuator-affecting intervention procedure has been performed in or on the actuator system 1. the suppressing engine 120 is further configured to output a suppressing signal 172 indicating at least one suppressing time period 182 in which the actuator-affecting intervention procedure has been performed.

The suppressing time period 182 may comprise the time period throughout which the actuator-affecting intervention procedure has been performed, such as the flipping of a switch or a slow shutdown. The suppressing time period 182 for the monitoring signal 173 of one individual actuator 2 may also, alternatively or additionally, comprise an overlapping and/or subsequent time period in which the initiated actuator-affecting intervention procedure influences the actuator 2.

For example, switching on a pump (as an example of an actuator 2) may cause a pressure curve that quickly increases up to a saturation value; in that case, the suppressing time period 182 may last from the switching on of the pump until a time point when the saturation pressure has been reached, or until a predetermined percentage of the saturation value has been reached.

The first trained artificial intelligence entity 122 may, in particular, be a first artificial neuronal network. Advantageously, said first artificial neuronal network 122 is realized as an artificial neuronal network using deep learning methods, in particular as a convolutional autoencoder. It should be understood that also other types of artificial neuronal networks or any other novelty detection model may be used.

Advantageously, in order to provide the apparatus 100, the first artificial neuronal network 122 is trained with samples of time periods in which at least one actuator-affecting intervention procedure has been performed. Advantageously, the first artificial neuronal network 122 may be trained to output a 0 (logical ZERO or LO) as a function of time for time periods in which a actuator-affecting intervention procedure has been performed, and to output a 1 (logical ONE or HI) as a function of time for time periods in which no actuator-affecting intervention procedure has been performed.

The suppressing engine 120 may be implemented as pure hardware, e.g. as comprising transistors, logic gates and other circuitry. Additionally, the suppressing engine 120 may be partially realized in terms of software. As such, the suppressing engine 120 may comprise a processor and a memory storing a software or a firmware that is executed by the processor. Signals may be received by an input interface of the suppressing engine 120 and signals that the processor of the suppressing engine 120 creates may be outputted by an output interface of the suppressing engine 120. The suppressing engine 120 may be implemented as, or using, a microcontroller, an ASIC, an FPGA and so on, optionally in combination with a non-volatile memory. The physical elements that the suppressing engine 120 consists of, or uses, may optionally be shared with other pieces of hardware or software. In particular, both the anomaly detector 110 and the suppressing engine 120 may, partially or completely, use the same hardware.

The apparatus 100 further comprises a combiner logic 130 configured to determine time periods of interest for the monitoring of the actuator system 1 and to output a monitoring signal 173 indicating the determined time periods of interest 180. The combiner logic 130 determines each anomaly time period 181 indicated by the anomaly signal as a period of interest if (advantageously: if and only if, and only as long as) the suppressing signal 172 does not indicate a simultaneous suppressing time period 182.

The combiner logic 130 may be implemented as pure hardware, e.g. as comprising transistors, logic gates and other circuitry. Additionally, the combiner logic 130 may be partially realized in terms of software. As such, the combiner logic 130 may comprise a processor and a memory storing a software or a firmware that is executed by the processor. Signals may be received by an input interface of the combiner logic 130 and signals that the processor of the combiner logic 130 creates may be outputted by an output interface of the combiner logic 130. The combiner logic 130 may be implemented as, or using, a microcontroller, an ASIC, an FPGA and so on, optionally in combination with a non-volatile memory. The physical elements that the combiner logic 130 consists of, or uses, may optionally be shared with other pieces of hardware or software, e.g. with the suppressing engine 120 and/or the anomaly detector 110.

The apparatus 100 may also comprise optional output circuitry 160, or an output device, configured to output a visual, acoustic and/or a haptic signal 177 to a user based on the periods of interest indicated by the monitoring signal 173. Examples for an output device are a display, a loudspeaker, a vibrator and the like.

Figure 2:
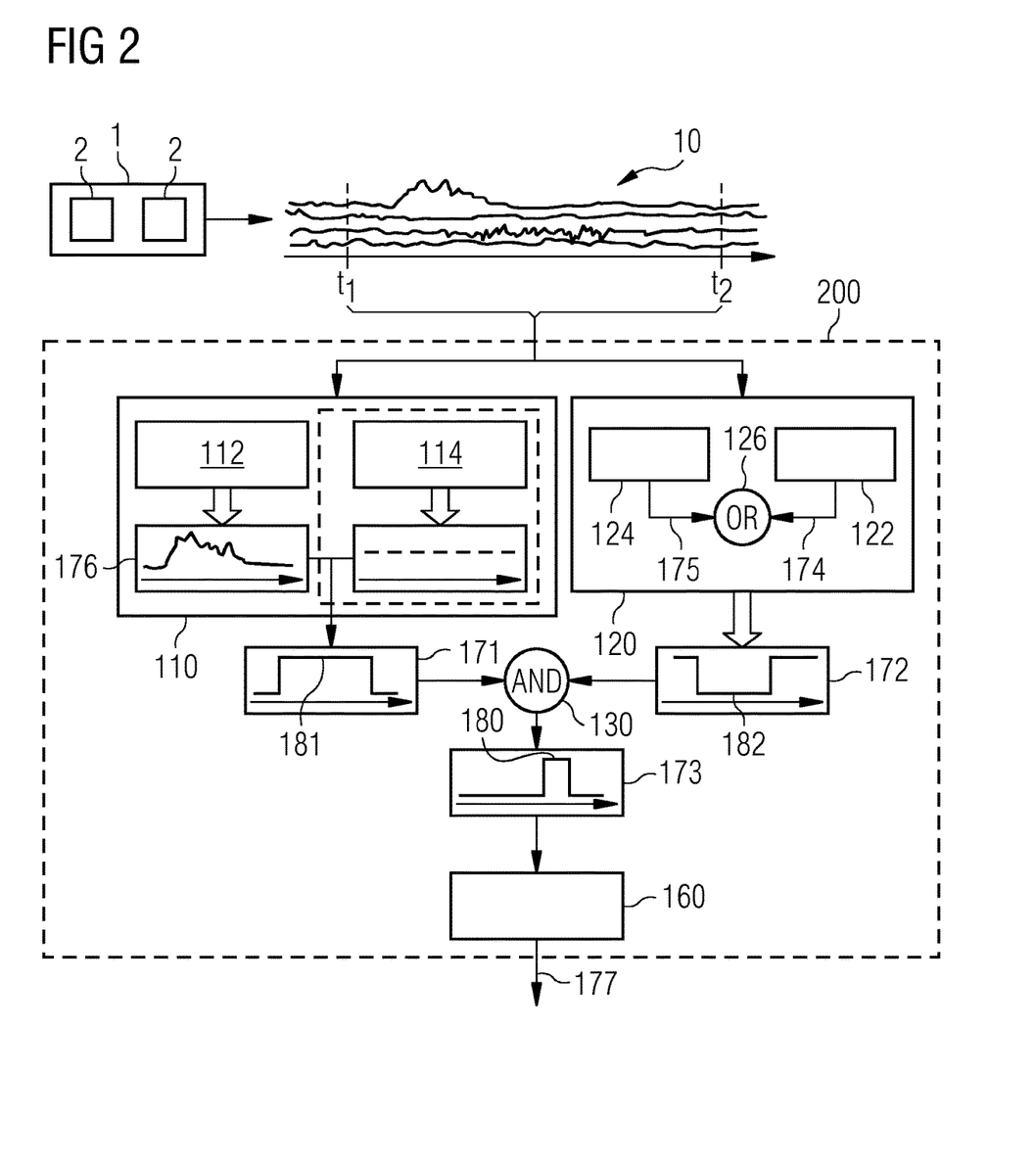
FIG. 2 schematically illustrates an apparatus according to another embodiment of the first aspect of the present invention.

FIG. 2 shows a schematic illustration of an apparatus 200 for monitoring an actuator system 1 with a plurality of actuators 2 and a plurality of data output signals 10 according to another embodiment. In particular, with respect to FIG. 2 optional additional details of the apparatus 100 are illustrated.

As shown in FIG. 2, in addition to the first trained artificial intelligence entity 122, the suppressing engine 120 may, optionally, comprise a determining engine 124. The determining engine 124 is configured to determine, based on a predetermined set of rules and on the plurality of data output signals 10, further suppressing time periods 182. The further suppressing time periods 182 may overlap, or be identical, with suppressing time periods 182 identified by the first trained artificial intelligence entity 122, or may even be completely separate.

For example, the determining engine 124 may be provided with the predetermined set of rules based on statistical evaluations of historical values of the data output signals 10. This can be useful because some actuator-affecting intervention procedures may be statistically defined and may be described by mathematical formulas. Such formulas may be generalized for different hardware, environmental conditions and/or time frames.

As an example, one simple rule could indicate that a suppressing time period 182 of a certain duration occurs (i.e. should be determined by the determining engine 124) at a certain pump whenever an operator initiates a restart of that pump after it has been switched off. A more complex example is a rule that takes into account the time delay of a pressure propagation from one pump that is being switched on or off to each of the other pumps of the actuator system. For each of the monitoring signals 173 of (some or all of) the other pumps, the suppressing engine 120 may determine a suppressing time period 182 based on the actuator-affecting intervention procedure and on the statistically determined, or known, time delay for each respective pump.

The suppressing time periods 182 indicated by the determining engine 124 may be added to the time periods determined by the first trained artificial intelligence entity 122 such that the suppressing signal 170 to output by the suppressing engine 120 indicates both suppressing time periods 182 that have been determined by the first trained artificial intelligence entity 122 and by the determining engine 124.

As illustrated in FIG. 2, in some advantageous embodiments, the first trained artificial intelligence entity 122 may be configured to output a first preliminary suppressing signal 174 as a binary signal, that is, as a signal having a target set of two discrete values, 0 and 1 (i.e. logical ZERO/LO and logical ONE/HI). Similarly, in advantageous embodiments the determining engine 124 may be configured to output a second preliminary suppressing signal 175 as a binary signal with a discrete values of 0 and 1.

The suppressing engine 120 may further comprise a logic 126 configured to combine the first and the second preliminary suppressing signal 174, 175 using a logical "OR" operator to create the suppressing signal 172. In other words, the first and the second preliminary suppressing signals 174, 175 and the suppressing signal 172 may simply be single binary timelines. As illustrated in FIG. 2, a logical 0 of the suppressing signal 172 may indicate a suppressing time period 182 and a logical 1 of the suppressing signal 172 may indicate time periods which are not suppressing time periods 182, that is, time periods in which no actuator-affecting intervention procedure has been performed (or at least, has not been detected).

It will be understood that the role of logical 0 and logical 1 may be reversed and that the suppressing signal 172 could also be provided with a non-binary target set. For example, the suppressing signal 172 could have a target set of a range of continuous values which indicate the likelihood, or probability, of a time period being a suppressing time period 182 (values closer to 0) or not being a suppressing time period 182 (values closer to 1).

Such a range of continuous values of the target set of the suppressing signal 172 does not have to be a range between 0 and 1 but may also be a range between two different values such as values between 1 and 5000. Similarly, the target set of the suppressing signal 172 may be a set of discrete values with more than two values such as values of integer numbers between 0 and 10. In that example, 0 may designate absolute certainty that a time period is a suppressing time period 182 and 10 may designate absolute certainty that a time period is not a suppressing time period 182; whereas the values 1 to 9 may designate various proportionate (or, e.g., logarithmic) likelihoods of the time period being a suppressing time period 182, or not.

Furthermore, as also illustrated in FIG. 2, the anomaly detector 110 may be realized as follows: The anomaly detector 110 may comprise a second artificial neuronal network 112 which is configured and trained to produce a preliminary anomaly signal 176 and a threshold comparator 114. The preliminary anomaly signal 176 has a target set of a range of continuous values, e.g. between 0 and 1. The second artificial neuronal network 112 may in some embodiments be combined with a support vector machine, or a support vector method.

The second artificial neuronal network 112 is advantageously trained with samples of time periods in which no anomaly has occurred. When the second artificial neuronal network 112 is e.g. trained to output a signal of 0 in the case of no anomaly, then higher (i.e. non-zero) values of the preliminary anomaly signal 176 during actual operation of the anomaly detector 110 indicate a higher likelihood that an anomaly has occurred.

The threshold comparator 114 may be configured to perform a comparison of the preliminary anomaly signal 176 with a threshold value and to output for the anomaly signal 171 either a first value, for example 1, that indicates that an anomaly has occurred or a second value, for example 0, that indicates that no anomaly has occurred, depending on the result of the comparison. In this way, the anomaly signal 171 can be created as a single binary timeline. It will be understood, however, that also the anomaly signal 171 can be provided with a target set of more than two discrete values or even with a target set of a range of continuous values, the various values indicating a likelihood, or probability, that an anomaly has occurred.

In the example described with respect to FIG. 2, the threshold comparator 114 is configured such that time periods in which the preliminary anomaly signal 176 has values at or above the threshold value lead to said time periods having a value of logical 1 in the anomaly signal 171 and that time periods in which the preliminary anomaly signal 176 has values below the threshold lead to said time periods having a value of logical 0 in the anomaly signal 171. In other words, in the example of FIG. 2, the anomaly signal 171 is a single binary timeline. As in the above example the preliminary anomaly signal 176 has a target set of values between 0 and 1, the threshold value used by the threshold comparator 114 will be a value between 0 and 1, for example 0.5.

As further illustrated in FIG. 2, the combiner logic 130 may be configured to realize, in some embodiments, a simple logical "AND" operator. This is particularly useful when both the anomaly signal 171 and the suppressing signal 172 are configured to be binary timelines, i.e. binary signals. Then, when the combiner logic 130 outputs the monitoring signal 173 as a logical "AND" connection of the anomaly signal 171 and the suppressing signal 172, automatically the monitoring signal 173 will, when the definitions are chosen as described in the above example, indicate an anomaly has been detected by the anomaly detector 110 and that has occurred outside of suppressing time periods 182 with a logical 1. The time periods having a value of logical 1 in the monitoring signal 173 in this way indicate periods of interest 180.

The apparatus 200 described with respect to FIG. 2 may also comprise the optional output circuitry 160 and/or the output device as described with respect to the apparatus 100.

In the main example described with respect to FIG. 2, the periods of interest are indicated by logical is of the monitoring signal 173. It will be understood that also the monitoring signal 173 may comprise more than two discrete values and may additionally comprise more information about the anomaly detected. The visual, acoustic and/or haptic signal output to the user may be provided at different levels of details.

For example, at a first level, the signal 177 output to the user may simply indicate whether an anomaly has occurred or not, optionally together with the time period in which the anomaly has occurred and/or with an information about the duration of the time period in which the anomaly has been detected.

At a second level, an additional criticality information may be provided to the user, for example criticality information which informs the user whether the present output to the user is a mere piece of information, a warning or even an alert. The criticality information may be determined by the output circuitry for example based on the duration of the time period of interest.

At a third level, the output circuitry 160 may configure the signal 177 that is output to the user, based on the time periods of interest and on additional information, as indicating the likelihood of a certain type of anomaly and/or a likelihood of a certain location connected to the anomaly.

Especially when the apparatus 200 is configured to output a plurality of signals 177 to the user, each signal 177 based on a monitoring signal 173 for a single actuator, then the signals 177 output to the user may indicate an urgency rating which informs the user how urgently, especially relatively to one another, the user's attention is needed for each of the signals 177. For example, a signal 177 that indicates a potential catastrophic failure of a large number of actuators 2 even with a low probability may be classified as more urgent than a signal 177 indicating a repairable fault at a single actuator 2 with a high probability.

Figure 3:
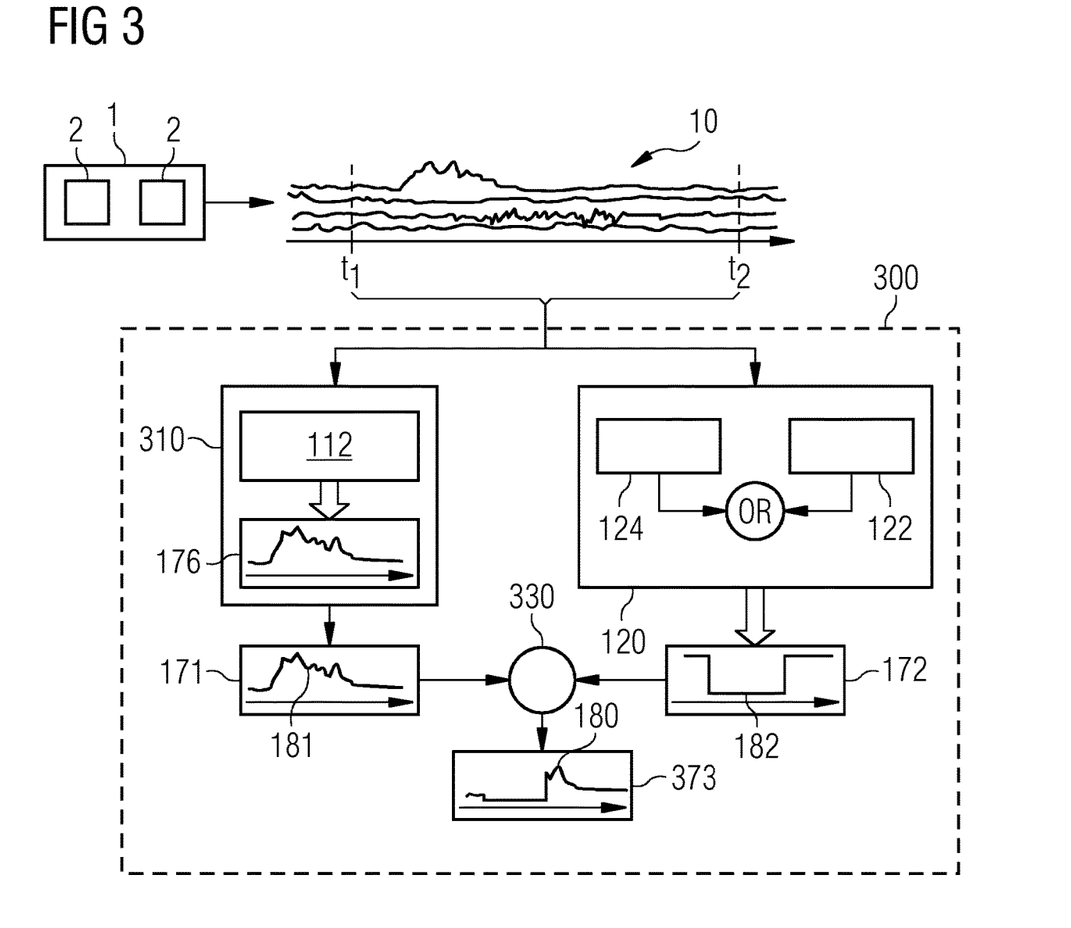
FIG. 3 schematically illustrates an apparatus according to yet another embodiment of the first aspect of the present invention.

FIG. 3 shows a schematic illustration of an apparatus 300 for monitoring an actuator system 1 with a plurality of actuators 2 and a plurality of data output signals 10 according to yet another embodiment of the present invention. The apparatus 300 described with respect to FIG. 3 is a variation of the apparatus 200 described with respect to FIG. 2.

The apparatus 300 comprises an anomaly detector 310 which includes the second artificial neuronal network 112 but which does not include the threshold comparator 114. The anomaly detector 310 is configured to output the preliminary anomaly signal 176, as described with respect to the apparatus 200, as the anomaly signal 171. Thus, the anomaly signal 171 is not a binary timeline but instead has a target set of a range of continuous values.

A combiner logic 330 of the apparatus 300 replaces the combiner logic 130 of the apparatus 200 of FIG. 2. The combiner logic 330 is configured to fold the anomaly signal 171 with the suppressing signal 172 to create a preliminary monitoring signal 373. In other words, the combiner logic 330 will output the preliminary monitoring signal 373 such that, in the preliminary monitoring signal 373: each time point or time period that is not within a suppressing time period 182 has the value indicated by the anomaly signal 171; and each time point or time period within a suppressing time period 182 has a value of 0.

The preliminary monitoring signal 373 itself may already be output as the monitoring signal 173, wherein time periods of interest 180 are time periods having non-zero values. Alternatively, a threshold comparator similar to the threshold comparator 114 of the apparatus 200 may be applied to the preliminary monitoring signal 373 in order to create the monitoring signal 173. In other words, in the monitoring signal 173 time periods having values at or above a threshold value are assigned a first value, and time periods having values below the threshold value are assigned a second value. Advantageously, the first and the second value are binary values, i.e. logical 1 and logical 0.

For example, the monitoring signal 173 may be created by the threshold comparator based on the preliminary monitoring signal 373 such that: each time point or time period that has a non-zero value in the preliminary monitoring signal 373 has a value of logical 1 in the monitoring signal 173; and each time point or time period that has a zero value in the preliminary monitoring signal 373 has a value of logical 0 in the monitoring signal 173.

The monitoring signal 173 may then be further processed as described in the foregoing or in the following, e.g. by the output circuitry 160 and/or by an output device.

Figure 4:
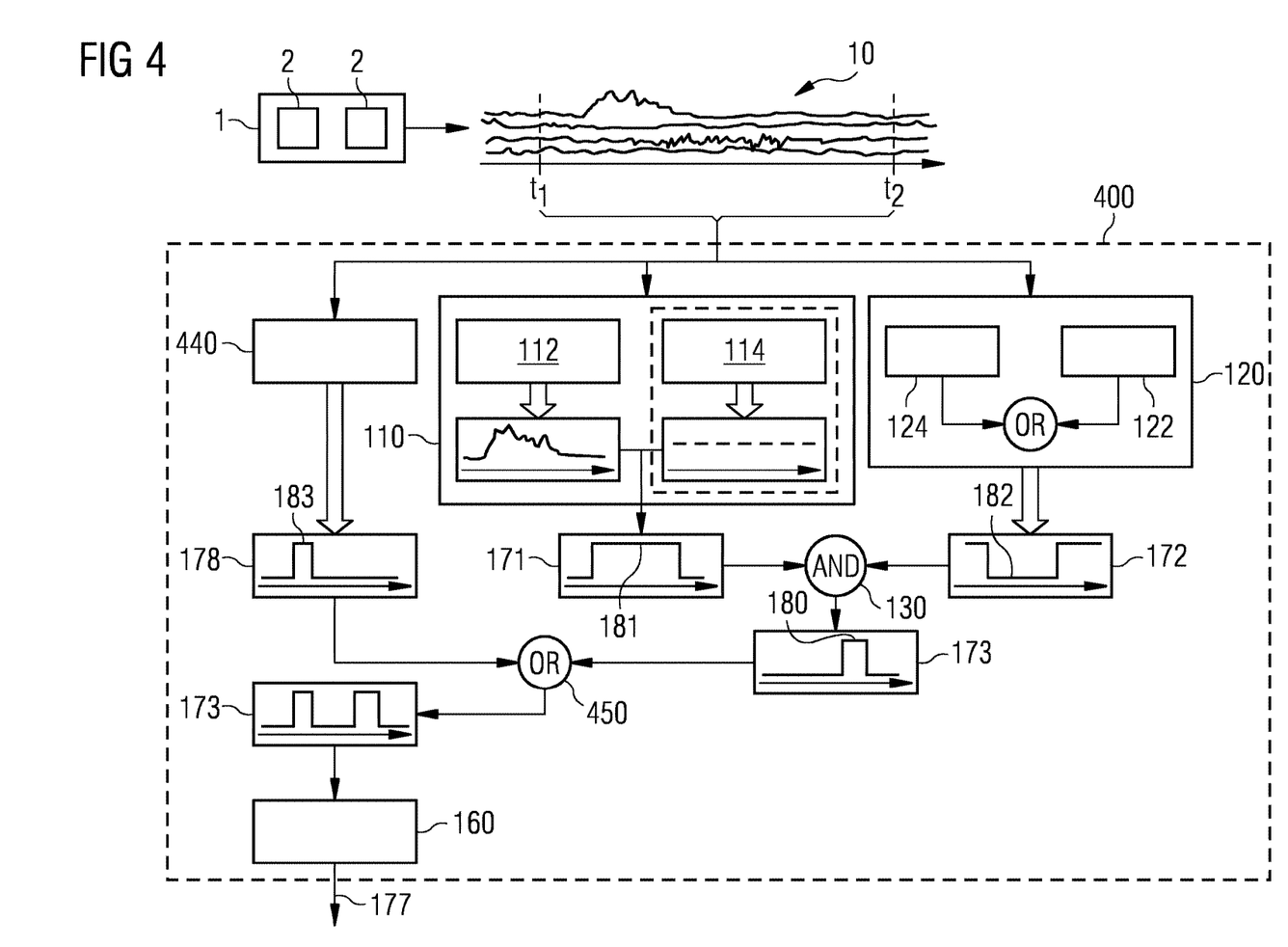
FIG. 4 schematically illustrates an apparatus according to still another embodiment of the first aspect of the present invention.

FIG. 4 shows a schematic illustration of an apparatus 400 for monitoring an actuator system 1 with a plurality of actuators 2 and a plurality of data output signals 10 according to still another embodiment of the present invention. The apparatus 400 described with respect to FIG. 4 is a variation of the apparatus 100 described with respect to FIG. 1 or with respect to FIG. 2. However, it should be understood that the principles explained with respect to the apparatus 400 may also be applied to variations of the apparatus 300 of FIG. 3.

With apparatus 400, the issue is addressed that actual anomalies may also occur during actuator-affecting intervention procedures, or control interventions. In those case, it is clearly not desired that such an anomaly is suppressed as a result of the suppressing engine 120 detecting the actuator-affecting intervention procedure. In order to remedy this, the apparatus 100 of FIG. 4 is provided with an anomaly classifier 440 and a modifier logic 450. The anomaly classifier 440 comprises, or consists of, a third trained artificial intelligence entity.

The third trained artificial intelligence entity is trained and configured to detect, based on the plurality of data output signals 10, a priority-rated anomaly. Priority-rated in the present context means that such an anomaly is desirably always detected as an anomaly and leads to a time period of interest in the monitoring signal 173, regardless of whether at the same time a actuator-affecting intervention procedure has been performed or not.

The anomaly classifier 440, particular the third trained artificial intelligence entity, is trained and configured to output a priority signal 178 indicating at least one priority time period 183 in which the priority-rated anomaly has been detected. Advantageously, the priority time period 183 starts when the priority-rated anomaly has started to occur and ends when the priority-rated anomaly has ended; however, the anomaly time period 181 may also be determined with a fixed or variable duration added before the priority-rated anomaly has occurred and/or after the priority-rated anomaly has ended.

The third trained artificial intelligence entity is advantageously trained on a data set with explicitly flagged time intervals comprising at least one specific anomaly. For example, the training set may include a plurality of time intervals in which a specific anomaly during a restart time period of a pump has occurred.

For instance, said anomaly may be a blockage of a pump during the restart of the pump. In that case, the pressure will rise steeply, much more steeply than usual during restart. The anomaly detector 110 will detect the anomaly which is unknown to it and indicate the corresponding time period in the anomaly signal 171. The suppressing engine 120 will, on the other hand, determine that a actuator-affecting intervention procedure has been performed, to wit, the restart of the pump, and will indicate a suppressing time period 182. Consequently, the anomaly detected by the anomaly detector 110 will not lead to a time period of interest 180 being added to the monitoring signal 173.

However, the anomaly classifier 440 will determine that an anomaly is indeed present, for example because the pattern of such a steep rise in pressure is known to the third trained artificial intelligence entity as due to a blockage during a restart of a pump.

Advantageously, the third trained artificial intelligence entity is realized as third artificial neuronal network. However, alternatively or additionally, various other methods of artificial intelligence may be used.

Optionally, the anomaly classifier 440 may, in addition to the third trained artificial intelligence entity, or even as an alternative to it, comprise a determining engine that determines at least one priority-rated anomaly based on a predetermined set of rules. For example, in the above situation with the blockage during the restart of a pump, said determining engine may detect the priority-rated anomaly based on a rule that says that such a steep rise in pressure is an anomaly regardless of the circumstances.

In the example illustrated with respect to FIG. 4, the anomaly classifier 440 generates a binary signal as a function of time where so-called priority time periods 183 (i.e. time periods in which a priority-rated anomaly has been detected) are denoted with a value of logical 1 and time periods in which no priority-rated anomaly has been detected are denoted with a value of logical 0.

The modifier logic 450 is configured to adapt the monitoring signal 173 is such that the monitoring signal 173 indicates the at least one priority time period 183 indicated by the priority signal 178 as a period of interest 180.

In the above-described example wherein the priority signal 178 is realized as a binary signal, and when also the monitoring signal 173 is realized as a binary signal, then the modifier logic 450 may be configured as realizing a logical "OR" operator acting between the priority signal 178 and the monitoring signal 173, wherein the modified monitoring signal 173 is the output of the logical "OR" operator.

In other words, the modified monitoring signal 173 comprises, as time periods of interest 180: a) time periods that have been detected by the anomaly detector 110 during time periods in which no actuator-affecting intervention procedure has been performed and detected by the suppressing engine 120 and b) time periods indicated by the anomaly classifier 440 as a priority time period 183.

In this way, it is ensured that, when a priority-rated anomaly (i.e. an anomaly known to the anomaly classifier 440) occurs during a suppressing time period 182, the occurrence of that anomaly is still indicated as a period of interest 180 in the modified monitoring signal 173 because it will be recognized by the anomaly classifier 440.

Advantageously, the apparatus 400 of FIG. 4 is thus able to detect and indicate both: a) previously known anomalies, by the anomaly classifier 440, and b) previously unknown (or very complex) anomalies, via the anomaly detector 110.

The anomaly classifier 440 and/or the modifier logic 450 may be implemented as pure hardware, e.g. as comprising transistors, logic gates and other circuitry. Additionally, the anomaly classifier 440 and/or the modifier logic 450 may be partially realized in terms of software. As such, the anomaly classifier 440 and/or the modifier logic 450 may comprise a processor and a memory storing a software or a firmware that is executed by the processor. Signals may be received by an input interface of the anomaly classifier 440 and/or the modifier logic 450 and signals that the processor of the anomaly classifier 440 and/or the modifier logic 450 creates may be outputted by an output interface of the anomaly classifier 440 and/or the modifier logic 450. The anomaly classifier 440 and/or the modifier logic 450 may be implemented as, or using, a microcontroller, an ASIC, an FPGA and so on, optionally in combination with a non-volatile memory. The physical elements that the anomaly classifier 440 and/or the modifier logic 450 consist of, or use, may optionally be shared with other pieces of hardware or software such as the anomaly detector 110 and/or the suppressing engine 120.

Figure 5:
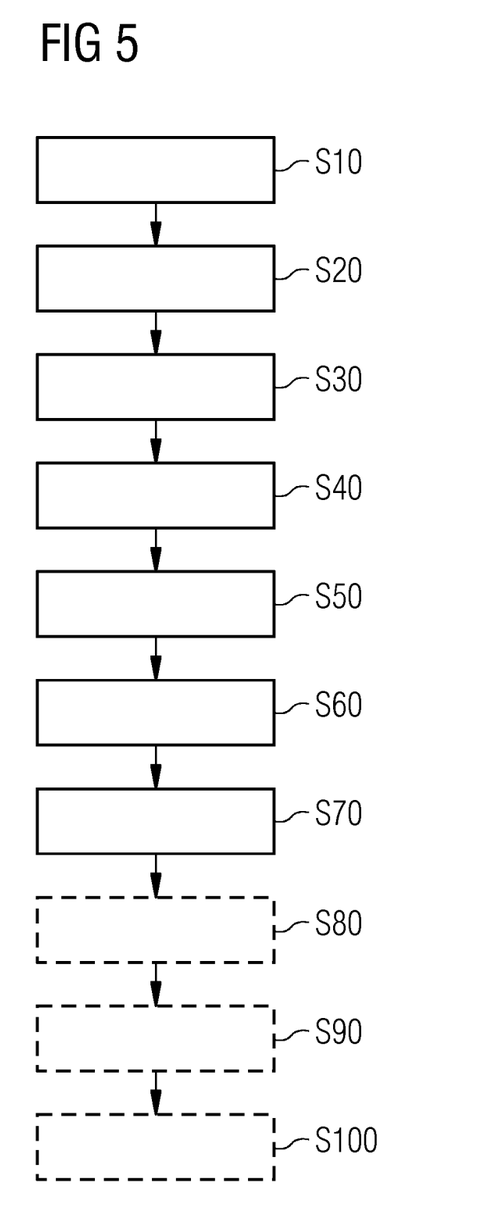
FIG. 5 schematically illustrates a flow diagram of a method according to an embodiment of the second aspect of the present invention.

FIG. 5 schematically illustrates a flow diagram of a method according to an embodiment of the second aspect of the present invention, the method being a method for monitoring an actuator system 1 with a plurality of actuators 2 and a plurality of data output signals 10. The method according to FIG. 5 is usable, and may be used, in particular with an apparatus according to the first aspect of the present invention, advantageously with any of the apparatus 100-400 described in the foregoing. Thus, the method according to FIG. 5 may be adapted to, and modified in analogy to, any variation, modification or optional feature that has been described with respect to the apparatus according to the first aspect, in particular with respect to any of the apparatus 100-400, and vice versa.

For the explanation of the method according to FIG. 5, specific reference will be made to reference signs used in the foregoing FIGS. 1-4. However, it should be understood that the method may be performed independently of the specific implementation details of any of the apparatus 100-400 as shown in FIGS. 1-4 unless explicitly specified otherwise.

In a step S10, the plurality of data output signals 10 is received, e.g. by a data input interface of any of the apparatus 100-400.

In a step S20, an anomaly occurring in the actuator system 1 is detected, or determined, based on the plurality of data output signals 10, e.g. as described in the foregoing with respect to the anomaly detector 110 of any of the apparatus 100, 200, 400 and/or with respect to the anomaly detector 310 of the apparatus 300. Advantageously, the anomaly is detected using a trained artificial intelligence entity 112 as described in the foregoing, especially using an artificial neuronal network such as a convolutional autoencoder or any other novelty detection model.

In a step S30, an anomaly signal 171 indicating at least one anomaly time period 181 in which the detected anomaly has occurred is outputted, e.g. as described in the foregoing with respect to the anomaly detector 110 of any of the apparatus 100, 200, 400 and/or with respect to the anomaly detector 310 of the apparatus 300.

In a step S40, it is determined, using a first trained artificial intelligence entity 122, based on the plurality of data output signals 10, whether a actuator-affecting intervention procedure has been performed in or on the actuator system 1.

In a step S50, a suppressing signal 172 is outputted, the suppressing signal 172 indicating at least one suppressing time period 182 based on the actuator-affecting intervention procedure that has been performed.

The suppressing time period 182 may be determined in any of the ways as has been described in the foregoing.

Specifically, step S40 and/or step S50 may be performed by the suppressing engine 120 of any of the apparatus 100-400, or as has been described with respect to the suppressing engine 120 of any of the apparatus 100-400.

This includes that, as has been described in the foregoing with respect to the determining engine 124, further suppressing time periods 182 may be determined based on a predetermined set of rules as well as on the plurality of data output signals.

In a step S60, at least one time period of interest 180 for the monitoring of the actuator system 1 is determined, e.g. as has been described with respect to the combiner logic 130 in the foregoing. Each anomaly time period indicated by the anomaly signal 171 is determined as a period of interest 180 if (advantageously: if and only if and only as long as) the suppressing signal 172 does not indicate a simultaneous suppressing time period 182.

In a step S70, at least one monitoring signal 173 indicating the determined time periods of interest 180 is outputted.

Advantageously, said at least one time period of interest 180 is determined for monitoring a subset of actuators 2 of the actuator system 1, advantageously for monitoring an individual actuator 2 of the actuator system 1. Advantageously, the method is used for monitoring individual pumps (advantageously submersible pumps, even more advantageously electrical submersible pumps) or individual conveyor belts.

The method may additionally comprise the following optional steps S80-S100:

In a step S80, a priority-rated anomaly is determined based on the plurality of data output signals 10. In a step S90, a priority signal 178 indicating at least one priority time period 183 based on the priority-rated anomaly that has been determined. The steps S80 and S90 may specifically be performed as has been described in the foregoing with respect to the anomaly classifier 440.

In a step S100, the monitoring signal 173 is adapted such that the monitoring signal 173 indicates the at least one priority time period 183 indicated by the priority signal 178 as a period of interest 180.

While detailed embodiments of the present invention are disclosed herein, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. In particular, features presented and described in separate dependent claims may be applied in combination and any advantageous combination of such claims are herewith disclosed.

Further, the terms and phrases used herein are not intended to be limiting; but rather, to provide an understandable description of the invention. The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language).

It will be evident that the described embodiments may be varied in many ways. All such modifications as would be evident to one skilled in the art starting from what is explicitly described are intended to be included.

The embodiments were chosen and described in order to best explain the principles of the invention and its practical applications, to thereby enable others skilled in the art to best utilize the invention and various embodiments with various modifications as are suited to the particular use contemplated. In the appended claims and throughout the specification, the terms "including" and "in which" are used as the plain-English equivalents of the respective terms "comprising" and "wherein," respectively. Furthermore, "a" or "one" does not exclude a plurality in the present case.

One basic idea of the invention may be described as follows: The invention provides an apparatus 100 for monitoring an actuator system 1 with a plurality of actuators 2 and a plurality of data output signals 10. An anomaly detector 110 detects anomalies. A suppressing engine 120 determines time periods in which a control intervention has been performed. In a resulting monitoring signal 173 only anomalies are indicated which do not overlap with time periods in which the control intervention has been performed.

Accordingly, much less irrelevant alerts and false positives are output to a human supervisor monitoring the actuator system. The invention is particularly useful when applied for monitoring a system of actuators that may affect one another over time, because in such systems a control intervention at one actuator might otherwise result in a lot of false positives for other actuators of the same system. The invention is especially useful when applied to a system of submersible pumps, or a system of conveyor belts.

The invention claimed is:

1. An apparatus for monitoring an actuator system with at least one actuator and at least one data output signal, the apparatus comprising:
    an anomaly detector configured to detect, based on the at least one data output signal, an anomaly occurring in the actuator system, and further configured to output an anomaly signal indicating at least one anomaly time period in which the detected anomaly has occurred;
    a suppressing engine comprising a first trained artificial intelligence entity trained and configured to determine, based on the at least one output signal, that an actuator-affecting intervention procedure has been performed in or on the actuator system, and to output a suppressing signal indicating at least one suppressing time period based on the actuator-affecting intervention procedure that has been performed; and
    a combiner logic configured to determine time periods of interest for the monitoring of the actuator system and to output a monitoring signal indicating the determined time periods of interest,
    wherein the combiner logic determines each anomaly time period indicated by the anomaly signal as a time period of interest if the suppressing signal does not indicate a simultaneous suppressing time period.

2. The apparatus of claim 1,
    wherein the anomaly detector comprises a second trained artificial intelligence entity configured and trained to output the anomaly signal.

3. The apparatus of claim 1, further comprising:
    an anomaly classifier and a modifier logic;
    wherein the anomaly classifier is configured to detect, based on the at least one data output signal, a priority-rated anomaly, and to output a priority signal indicating at least one priority time period based on the priority-rated anomaly that has been detected;
    wherein the modifier logic is configured to adapt the monitoring signal such that the monitoring signal indicates the at least one priority time period indicated by the priority signal as a time period of interest.

4. The apparatus of claim 1,
    wherein the suppressing engine further comprises a determining engine configured to determine, based on a predetermined set of rules and on the at least one data output signal, further suppressing time periods; and
    wherein the suppressing engine is configured to output the suppressing signal as indicating also the suppressing time periods determined by the determining engine.

5. The apparatus of claim 1, further comprising
    output circuitry and/or and output device configured to output a visual, acoustic and/or haptic signal to a user based on the time periods of interest indicated by the monitoring signal.

6. The apparatus of claim 1,
    wherein the anomaly signal and/or the suppressing signal and/or the monitoring signal has a target set of discrete values.

7. The apparatus of claim 1,
    wherein the anomaly detector is configured to produce a preliminary anomaly signal having a target set of a range of continuous values;

wherein the anomaly detector further comprises a threshold comparator configured to perform a comparison of the preliminary anomaly signal with a threshold value and to output the anomaly signal either with a first value that indicates that an anomaly has occurred or with a second value that indicates that no anomaly has occurred, depending on a result of the comparison.

8. The apparatus of claim 1,
wherein the monitoring signal has a target set of a range of continuous values, wherein a time period of interest is indicated by the monitoring signal having values within a first sub-range of the target set, and wherein time periods that are not time periods of interest are indicated by the monitoring signal having values within a second sub-range of the target set.

9. The apparatus of claim 1,
wherein at least one of the at least one data output signal relates to at least one pump, and wherein at least one monitoring signal is provided for monitoring the at least one pump.

10. A method for providing an apparatus for monitoring an actuator system with at least one actuator and at least one data output signal, the method comprising:
providing an anomaly detector configured to detect, based on the at least one data output signal, an anomaly occurring in the actuator system, and further to output an anomaly signal indicating at least one anomaly time period in which the detected anomaly has occurred;
providing a suppressing engine comprising a first artificial intelligence entity;
configuring the first artificial intelligence entity and training the first artificial intelligence entity to determine, based on the at least one output signal, that an actuator-affecting intervention procedure has been performed in or on the actuator system, and to output a suppressing signal indicating at least one suppressing time period based on the actuator-affecting intervention procedure that has been performed; and
providing a combiner logic configured to determine time periods of interest for the monitoring of the actuator system and to output a monitoring signal indicating the determined time periods of interest,
wherein the combiner logic is configured such as to determine each anomaly time period indicated by the anomaly signal as a time period of interest if the suppressing signal does not indicate a simultaneous suppressing time period.

11. The method of claim 10,
wherein the first artificial intelligence entity comprises, or consists of, a first artificial neuronal network; and
wherein the first artificial neuronal network is trained using samples of time periods in which at least one actuator-affecting intervention procedure has been performed.

12. The method of claim 10,
wherein the anomaly detector comprises a second artificial intelligence entity; and
wherein the method comprises a step of configuring the second artificial intelligence entity and a step of training the second artificial intelligence entity with samples of time periods in which no anomaly has occurred.

13. The method of claim 10, further comprising:
providing an anomaly classifier configured to detect, based on the at least one data output signal, a priority-rated anomaly, and to output a priority signal indicating at least one priority time period based on the priority-rated anomaly that has been detected;
wherein a third artificial neuronal network is provided as part of the anomaly classifier for determining the priority-rated anomaly;
training the third artificial neuronal network with samples of time periods in which at least one known anomaly has occurred; and
providing a modifier logic configured to adapt the monitoring signal such that the monitoring signal indicates the at least one priority time period indicated by the priority signal as a time period of interest.

14. A method for monitoring an actuator system at least one actuator and with at least one data output signal, the method comprising:
receiving the at least one data output signal;
detecting, based on the at least one data output signal, an anomaly occurring in the actuator system;
outputting an anomaly signal indicating at least one anomaly time period in which the detected anomaly has occurred;
determining, using a first trained artificial intelligence entity, based on the at least one data output signal, that an actuator-affecting intervention procedure has been performed in or on the actuator system,
outputting a suppressing signal indicating at least one suppressing time period based on the actuator-affecting intervention procedure that has been performed;
determining at least one time period of interest for the monitoring of the actuator system, wherein each anomaly time period indicated by the anomaly signal is determined as a period of interest if the suppressing signal does not indicate a simultaneous suppressing time period; and
outputting a monitoring signal indicating the determined time periods of interest.

15. The method of claim 14, further comprising:
determining, based on the at least one data output signal, a priority-rated anomaly;
outputting a priority signal indicating at least one priority time period based on the priority-rated anomaly that has been determined; and
adapting the monitoring signal such that the monitoring signal indicates the at least one priority time period indicated by the priority signal as a period of interest.

16. The method of claim 14, further comprising:
determining, based on a predetermined set of rules and on the at least one data output signal, further suppressing time periods,
wherein the suppressing signal is output such that it also indicates the suppressing time periods determined thereby.

* * * * *